June 30, 1970 V. BEZOUSKA ET AL 3,518,507

SEMICONDUCTOR DEVICE HAVING PRESSURE-HELD CONTACTS

Filed Nov. 25, 1968

United States Patent Office 3,518,507
Patented June 30, 1970

3,518,507

SEMICONDUCTOR DEVICE HAVING PRESSURE-HELD CONTACTS

Vlastimil Benzouška, Pruhonice, Jan Pivrnec, Jiří Hrdlička, Evžen Krása, and Zdeněk Smékal, Prague, Czechoslovakia, assignors to CKD Prague, oborovy podnik, Prague Czechoslovakia Filed Nov. 25, 1968, Ser. No. 778,450
Claims priority, application Czechoslovakia, Nov. 29, 1967, 8,451/67
Int. Cl. H01l *1/02*
U.S. Cl. 317—234 8 Claims

ABSTRACT OF THE DISCLOSURE

A semiconductor device comprising a semiconductor body having spaced opposite planar surfaces perpendicularly arranged about a central axis, a pair of principal electrodes abutting, respectively, the planar surfaces of the semiconductor body and frame members of dielectric material connected to the periphery of the electrode members to support the same as a unitary device.

DESCRIPTION OF THE INVENTION

Figure 1:
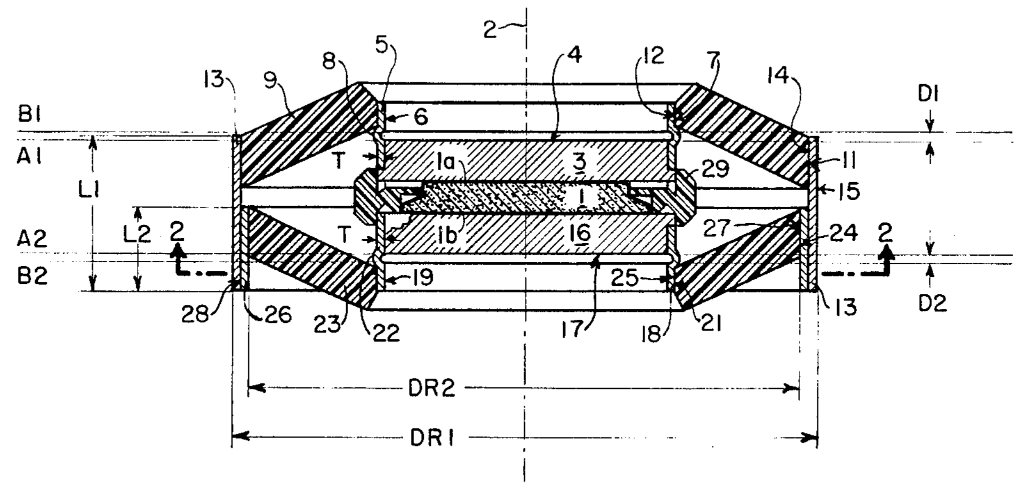

The present invention relates to a semiconductor device having pressure-held contacts. More particularly, the invention relates to a semiconductor device having a planar semiconductor junction body held in pressure contact with its electrodes.

Two types of known arrangement are used for contacting a planar semiconductor body or element with electrodes. In one case, a solid metallic bond is provided between the semiconductor element and the electrodes, usually by soldering. The principal disadvantage of such a bond is that the planar semiconductor element and the electrodes consist of materials having coefficients of thermal expansion which differ from each other. Due to thermal cycles, the soldered bonds often deteriorate, and this may result in destruction of the semiconductor body or element.

Another well known system of bonding electrodes to planar semiconductor junction elements, the so-called compression bond encapsulation, is presently preferred. This system of bonding provides a sliding contact. The advantage of such a sliding contact is that during thermal expansion, deterioration of the bond is avoided.

Two known types of housing or casing are utilized with this system of bonding. According to one practice, the casing is of orthodox type, comprising a base plate, which also serves as a first electrode. A spring holder is affixed to the base plate. The springs of the spring holder act on the semiconductor junction body or element through a second electrode to press the semiconductor body to the base plate. A shortcoming of this type of device is its costly production and the considerable space which it requires. The principal disadvantage is that only one-side cooling of the semiconductor body is possible.

At the present time, the other type of casing is most frequently used. In this casing, the principal planar electrodes are joined to each other by an interconnecting member, in conjunction with which the electrodes constitute a casing of simple structure. The casing includes a semiconductor junction body consisting of a single crystal silicon wafer having at least one pn junction and provided with terminal electrodes formed either by direct metal plating of the silicon wafer, or by the securing of stiffening plates thereto. The plates are of a material having a thermal coefficient of expansion which is similar to that of the semiconductor body. The semiconductor body contacts the functional surfaces of both electrodes.

The pressure necessary for achieving close contact between the electrodes and the semiconductor body is provided by pressure means located outside the casing. The pressure means usually comprises two heat sinks, which simultaneously provide two-side cooling of the semiconductor body.

In some casings of the aforedescribed type, the interconnecting member comprises two frames, each being a circular ring and each being secured at its inner edge to a corresponding one of the principal electrodes. The frames are provided with metallic extensions on their outer peripheral surfaces or circumferences and are connected to each other, usually by a weld, at such extensions. The metallic extensions have the configuration of flat rings, disposed in a plane perpendicular to the axis of the semiconductor device. The extensions facilitate axial movement of the principal electrodes to provide close engagement of the semiconductor body and the electrodes under pressure.

In the known devices, problems arise concerning the interconnection of the principal electrodes, which usually comprise copper, and the frame, which usually comprises dielectric material such as, for example, ceramics, which is brittle and has a very low coefficient of elasticity. The known semiconductor devices are usually of flat disc configuration, so that the expandable components have radial dimensions which are a multiple of their axial dimensions in magnitude. Thus, during thermal cycles, the adverse effects of the absolute values of thermal expansions first occur in radial directions. These disadvantages and problems occur during heat treatment in the production of the device, and during operation of the device. These disadvantages are overcome in the known devices by providing a metal diaphragm of circular ring or annular configuration between the principal rigid copper electrode and the annular frame of dielectric material. The diaphragm is positioned in a radial plane or a plane perpendicular to the axis of the device. The diaphragm compensates for thermal expansions in radial directions by its own deformation, so that a shearing stress is produced which can destroy the device at a heavy deformation. Furthermore, the device is intricate in manufacture.

Known devices also utilize intermediate members positioned between the principal electrode and the frame. The intermediate members are provided with flanges, so that when there is thermal expansion, the intermediate members are stressed in radial and axial directions. The aforedescribed shortcomings are overcome by the intermediate members much more effectively, functionally, than by the diaphragms. They are, however, complex in structure and very expensive in manufacture.

Intermediate members are utilized in another type of known semiconductor device. The intermediate member is of hollow cyindrical configuration and is positioned coaxially between an outer edge of the principal electrode and an inner edge of the frame. The frame is of annular configuration. The electrode and the frame are affixed to the intermediate member in the same plane. This arrangement is utilized only for easier bonding of copper to ceramic material and does not effect or react to thermal expansions.

The principal object of the present invention is to provide a new and improved semiconductor device having pressure-held contacts.

An object of the present invention is to provide a semiconductor device having pressure-held contacts, which device overcomes the disadvantages of the known devices.

An object of the present invention is to provide a semiconductor device having pressure-held contacts, which device is of simple structure and is inexpensive to manufacture.

An object of the present invention is to provide a semiconductor device having pressure-held contacts, which device compensates for thermal expansions in radial and axial directions without deforming the principal electrode or the frame.

An object of the present invention is to provide a semiconductor device having pressure-held contacts, which device functions efficiently, effectively and reliably in maintaining pressure contact between the electrodes and the semiconductor body.

In accordance with the present invention, each principal electrode is connected to a corresponding frame member of dielectric material via a corresponding intermediate member in a manner whereby the disadvantages of the known devices are overcome.

In accordance with the present invention, a semiconductor device comprises a semiconductor body having an axis and spaced opposite planar surfaces perpendicular to the axis. A first substantially rigid plate electrode abutting one planar surface of the semiconductor body has an outer planar surface perpendicular to the axis and spaced from the semiconductor body and a peripheral surface. A first intermediate member of hollow substantially cylindrical configuration is coaxially positioned around the first electrode and has a substantially cylindrical inner surface affixed to the first electrode at the peripheral surface thereof in a first inner plane coplanar with the plane of the outer planar surface of the first electrode and a substantially cylindrical outer surface. The first intermediate member has a determined radial thickness. A first frame member of substantially annular configuration is coaxially positioned around the first intermediate member and has a substantially cylindrical outer surface and a substantially cylindrical inner surface affixed to the outer surface of the first intermediate member in a first outer plane defined by the inner surface of the first frame member affixed to the first intermediate member and adjoining said first intermediate member closest the first electrode and parallel to that of the outer planar surface of the first electrode. The first inner and first outer planes are spaced from each other by a distance at least equal to the determined radial thickness of the first intermediate member at its area between the first electrode and the first frame member. A first outer member of hollow substantially cylindrical configuration is coaxially positioned around the first frame member and has a substantially cylindrical inner surface affixed to the outer surface of the first frame member, a substantially cylindrical outer surface, a first diameter and a first altitude. A second substantially rigid plate electrode abuts the other planar surface of the semiconductor body. The second electrode has an outer planar surface perpendicular to the axis and spaced from the semiconductor body and a peripheral surface. A second intermediate member of hollow substantially cylindrical configuration is coaxially positioned around the second electrode and has a substantially cylindrical inner surface affixed to the second electrode at the peripheral surface thereof in a second inner plane coplanar with the plane of the outer planar surface of the second electrode and a substantially cylindrical outer surface. The second intermediate member has a determined radial thickness. A second frame member of substantially annular configuration is coaxially positioned around the second intermediate member and has a substantially cylindrical outer surface and a substantially cylindrical inner surface affixed to the outer surface of the second intermediate member in a second outer plane defined by the inner surface of the second frame member affixed to the second intermediate member and adjoining the second intermediate member closest the second electrode and parallel to that of the outer planar surface of the second electrode. The second inner and second outer planes are spaced from each other by a distance at least equal to the determined radial thickness of the second intermediate member at its area between the second electrode and the second frame member. A second outer member of hollow substantially cylindrical configuration is coaxially positioned around the second frame member and has a substantially cylindrical inner surface affixed to the outer surface of the second frame member, a substantially cylindrical outer surface, a second diameter and a second altitude. One of the first and second diameters is greater than the other and the corresponding one of the first and second altitudes is longer than the other in a manner whereby part of the inner surface of one of the first and second outer members abuts the entire outer surface of the other of the outer members, the first and second outer members being affixed to each other.

Each of the first and second outer members comprises metal. Each of the first and second intermediate members comprises metal. Each of the first and second frame members comprises dielectric material. Each of the first and second frame members comprises a substantially frustoconical section. Each of the frustoconical sections has a minor base and a major base of greater cross-sectional area opening toward the other. Each of the frustoconical sections comprises dielectric material. A corrugation is formed in each of the first and second intermediate members in a plane perpendicular to the axis in the area between the first inner and outer planes and in the area between the second inner and outer planes.

Figure 2:
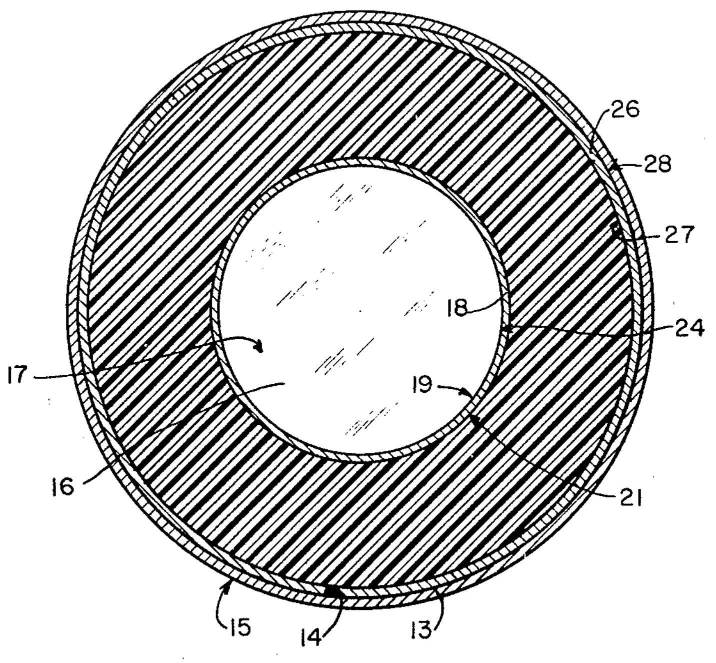

In order that the present invention may be readily carried into effect, it will now be described with reference to the accompanying drawings, wherein:

FIG. 1 is a sectional view of an embodiment of the semiconductor device of the present invention, FIG. 2 is a sectional view taken along line 2—2 of FIG. 1.

In the figures, a semiconductor body 1 has an axis 2 and spaced opposite planar surfaces 1*a* and 1*b* perpendicular to said axis. A first principal electrode 3 abuts the upper planar surface 1*a* of the semiconductor body 1 with the lower planar surface of said electrode. The first electrode 3 has an outer planar surface 4 parallel to its lower planar surface, perpendicular to the axis 2, and spaced from the semiconductor body 1. The first electrode 3 comprises a rigid copper plate having a peripheral or circumferential surface and functions as an anode.

A first intermediate member 5 of hollow substantially cylindrical configuration is coaxially positioned around the first electrode 3. The first intermediate member 5 has a substantially cylindrical inner surface 6 affixed to the first electrode 3 at the peripheral surface thereof in a first inner plane A1. The first inner plane A1 is coplanar with the plane of the outer planar surface 4 of the first electrode 3.

The first intermediate member 5 is preferably of metal and has a cylindrical outer surface 7 and a determined radial thickness T between its inne rand outer surfaces 6 and 7. A corrugation 8 is formed in the first intermediate member 5 in a plane perpendicular to the axis 2 in the area between the first inner plane A1 and a first outer plane B1, hereinafter described.

A first frame member 9 of substantially annular configuration is coaxially positioned around the first intermediate member 5. The first frame member 9 is preferably of dielectric material such as, for example, ceramic material and is of frustoconical section having a substantially cylindrical outer surface 11 and a substantially cylindrical inner surface 12 affixed to the outer surface 7 of the first intermediate member 5.

The first frame member 9 is of frustoconical section having a minor base spaced further from the semiconductor body 1 and a major base of greater cross-sectional area than the minor base. The major base is closer to the semiconductor body 1 and opens toward it.

The inner surface 12 of the first frame member 9 is affixed to the outer surface 7 of the first intermediate member 5 in a first outer plane B1 defined by the inner surface 12 of said first frame member affixed to said first intermediate member closest the first electrode 3 and parallel to the plane of the outer planar surface 4 of said first electrode. The first outer plane B1 is, in other words, the plane of the circle formed by the contacting surfaces of the first intermediate member 5 and the first frame member 9 closest the first electrode 3.

In accordance with the present invention, the first inner and first outer planes A1 and B1 are spaced from each other by a distance D1 at least equal to the determined radial thickness T of the first intermediate member 5 at its area between the first electrode 3 and the first frame member 9.

A first outer member 13 of hollow substantially cylindrical configuration is coaxially positioned around the first frame member 9. The first outer member 13 has a substantially cylindrical inner surface 14 affixed to the outer surface 11 of the first frame member 9. The first outer member 13 has a substantially cylindrical outer surface 15, a first diameter DR1, which is its average or mean diameter, and a first altitude L1. The first outer member 13 preferably comprises metal, and may comprise, for example, an iron-nickel alloy.

A second principal electrode 16 abuts the lower planar surface 1*b* of the semiconductor body 1 with the upper planar surface of said electrode. The second electrode 16 has an outer planar surface 17 parallel to its upper planar surface, perpendicular to the axis 2, and spaced from the semiconductor body 1. The second electrode 16 comprises a rigid copper plate having a peripheral or circumferential surface and functions as a cathode.

A second intermediate member 18 of hollow substantially cylindrical configuration is coaxially positioned around the second electrode 16. The second intermediate member 18 has a substantially cylindrical inner surface 19 affixed to the second electrode 16 at the peripheral surface thereof in a second inner plane A2. The second inner plane A2 is coplanar with the plane of the outer planar surface 17 of the second electrode 16.

The second intermediate member 18 is preferably of metal and has a cylindrical outer surface 21 and a determined radial thickness T between its inner and outer surfaces 19 and 21. A corrugation 22 is formed in the second intermediate member 18 in a plane perpendicular to the axis 2 in the area between the second inner plane A2 and a second outer plane B2, hereinafter described.

A second frame member 23 of substantially annular configuration is coaxially positioned around the second intermediate member 18. The second frame member 23 is preferably of dielectric material such as, for example, ceramic material, and is of frustoconical section having a substantially cylindrical outer surface 24 and a substantially cylindrical inner surface 25 affixed to the outer surface 21 of the second intermediate member 18.

The second frame member 23 is of frustoconical section having a minor base spaced farther from the semiconductor body 1 and a major base of greater cross-sectional area than the minor base. The major base is closer to the semiconductor body 1 and opens toward it and toward the first frame member 9.

The inner surface 25 of the second frame member 23 is affixed to the outer surface 21 of the second intermediate member 18 in a second outer plane B2 defined by the inner surface 25 of said second frame member affixed to said second intermediate member closest the second electrode 16 and parallel to the plane of the outer planar surface 17 of said second electrode. The second outer plane B2 is, in other words, the plane of the circle formed by the contacting surfaces of the second intermediate member 18 and the second frame member 23 closest the second electrode 16.

In accordance with the present invention, the second inner and outer planes A2 and B2 are spaced from each other by a distance D2 at least equal to the determined radial thickness T of the second intermediate member 18 at its area between the second electrode 16 and the second frame member 23.

A second outer member 26 of hollow substantially cylindrical configuration is coaxially positioned around the second frame member 23. The second outer member 26 has a substantially cylindrical inner surface 27 affixed to the outer surface 24 of the second frame member 23. The second outer member 26 has a substantially cylindrical outer surface 28, a second diameter DR2, which is its average or mean diameter, and a second altitude L2. The second outer member 26 preferably comprises metal, and may comprise, for example, an iron-nickel alloy.

The first diameter DR1 of the first outer member 13 is greater than the second diameter DR2 of the second outer member 26, and the first altitude L1 of said first outer member is longer than the second altitude L2 of said second outer member. As seen in the figure, approximately the lower half of the inner surface 14 of the first outer member 13 abuts the entire outer surface 28 of the second outer member 26 and is affixed thereto. The first and second outer members 13 and 26 are affixed to each other by any suitable means such as, for example, a weld, or solder, or a solder layer (not shown in the figure).

The frustoconical configurations of the first and second frame members 9 and 23, an dtheir positions opening toward each other at their major bases improve the compensation for thermal expansions during operation.

The semiconductor body 1 may be embedded in a protective ring 29 of tetrafluorethylene or Teflon.

The semiconductor device of the present invention may be manufactured by first preparing a first subassembly of the first electrode 3, the first intermediate member 5, the first frame member 9 and the first outer member 13 and a second subassembly of the second electrode 16, the second intermediate member 18, the second frame member 23 and the second outer member 26.

The semiconductor body 1 is then placed on the second electrode 16 of the second subassembly, and the first subassembly is positioned with the second outer member 26 coaxially inside and next adjacent the first outer member 13 of said second subassembly. A suitable tool is then utilized to apply a minimum predetermined pressure to urge the first and second subassemblies to each other via the first and second electrodes 3 and 16. The planar abutting surfaces or contact surfaces of the first and second electrodes 3 and 16 and of the semiconductor body 1 are brought into contact with each other. This eliminates any possible adverse effect, due to manufacturing tolerances, on the electrical contact between the semiconductor body 1 and the electrodes 3 and 16. The first and second outer members 13 and 26 are then affixed to each other.

While the invention has been described by means of specific examples and in specific embodiments, we do not wish to be limited thereto, for obvious modifications will occur to those skilled in the art without departing from the spirit and scope of the invention.

What we claim is:

1. A semiconductor device comprising:

a semiconductor body having an axis and spaced opposite planar surfaces perpendicular to said axis;

a first substantially rigid plate electrode abutting one planar surface of said semiconductor body, said first electrode having an outer planar surface perpendicular to said axis and spaced from said semiconductor body and a peripheral surface;

a first intermediate member of hollow substantially cylindrical configuration coaxially positioned around said first electrode and having a substantially cylindrical inner surface affixed to said first electrode at the peripheral surface thereof in a first inner plane coplanar with the plane of the outer planar surface of said first electrode and a substantially cylindrical outer surface, said first intermediate member having a determined radial thickness;

a first frame member of substantially annular configuration coaxially positioned around said first intermediate member and having a substantially cylindrical outer surface and a substantially cylindrical inner surface affixed to the outer surface of said first intermediate member in a first outer plane defined by the inner surface of said first frame member affixed to said first intermediate member and adjoining said first intermediate member closest said first electrode and parallel to that of the outer planar surface of said first electrode, said first inner and first outer planes being spaced from each other by a distance at least equal to the determined radial thickness of said first intermediate member at its area between said first electrode and said first frame member;

a first outer member of hollow substantially cylindrical configuration coaxially positioned around said first frame member having a substantially cylindrical inner surface affixed to the outer surface of said first frame member, a substantially cylindrical outer surface, a first diameter and a first altitude;

a second substantially rigid plate electrode abutting the the other planar surface of said semiconductor body, said second electrode having an outer planar surface perpendicular to said axis and spaced from said semiconductor body and a peripheral surface;

a second intermediate member of hollow substantially cylindrical configuration coaxially positioned around said second electrode and having a substantially cylindrical inner surface affixed to said second electrode at the peripheral surface thereof in a second inner plane coplanar with the plane of the outer planar surface of said second electrode and a substantially cylindrical outer surface, said second intermediate member having a determined radial thickness;

a second frame member of substantially annular configuration coaxially positioned around said second intermediate member and having a substantially cylindrical outer surface and a substantially cylindrical inner surface affixed to the outer surface of said second intermediate member in a second outer plane defined by the inner surface of said second frame member affixed to said second intermediate member and adjoining said second intermediate member closest said second electrode and parallel to that of the outer planar surface of said second electrode, said second inner and second outer planes being spaced from each other by a distance at least equal to the determined radial thickness of said second intermediate member at its area between said second electrode and said second frame member; and a second outer member of hollow substantially cylindrical configuration coaxially positioned around said second frame member having a substantially cylindrical inner surface affixed to the outer surface of said second frame member, a substantially cylindrical outer surface, a second diameter and a second altitude, one of said first and second diameters being greater than the other and the corresponding one of the first and second altitudes being longer than the other in a manner whereby part of the inner surface of one of said first and second outer members abuts the entire outer surface of the other of said outer members, said first and second outer members being affixed to each other.

2. A semiconductor device as claimed in claim 1, wherein each of said first and second outer members comprises metal.

3. A semiconductor device as claimed in claim 1, wherein each of said first and second frame members comprises dielectric material.

4. A semiconductor device as claimed in claim 1, wherein each of said first and second frame members comprises a substantially frustoconical section.

5. A semiconductor device as claimed is claim 1, wherein each of said first and second intermediate members comprises metal.

6. A semiconductor device as claimed in claim 1, further comprising a corrugation in each of said first and second intermediate members in a plane perpendicular to said axis in the area between the first inner and outer planes and in the area between the second inner and outer planes.

7. A semiconductor device as claimed in claim 4, wherein each of said frustoconical sections has a minor base and a major base of greater cross-sectional area opening toward the other.

8. A semiconductor device as claimed in claim 7, wherein each of said frustoconical sections comprises dielectric material.

References Cited

UNITED STATES PATENTS

| | | | |
|---|---|---|---|
| 3,313,987 | 4/1967 | Boyer | 317—234 |
| 3,443,168 | 5/1969 | Camp et al. | 317—234 |

JERRY D. CRAIG, Primary Examiner